(12) United States Patent
Chiang et al.

(10) Patent No.: US 10,522,530 B2
(45) Date of Patent: Dec. 31, 2019

(54) ELECTROSTATIC DISCHARGE SHIELDING SEMICONDUCTOR DEVICE AND ELECTROSTATIC DISCHARGE TESTING METHOD THEREOF

(71) Applicant: UNITED MICROELECTRONICS CORP., Hsin-Chu (TW)

(72) Inventors: Chun Chiang, Hsinchu (TW); Ying-Wei Tseng, Nantou County (TW); Ping-Chen Chang, Pingtung County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/927,107

(22) Filed: Mar. 21, 2018

(65) Prior Publication Data

US 2019/0273077 A1  Sep. 5, 2019

(30) Foreign Application Priority Data

Mar. 1, 2018  (CN) .......................... 2018 1 0171235

(51) Int. Cl.
| | |
|---|---|
| *H01L 23/552* | (2006.01) |
| *H01L 27/02* | (2006.01) |
| *H01L 23/60* | (2006.01) |
| *G01R 31/00* | (2006.01) |
| *G01R 31/28* | (2006.01) |
| *H01L 23/10* | (2006.01) |

(52) U.S. Cl.
CPC ........ *H01L 27/0248* (2013.01); *G01R 31/002* (2013.01); *G01R 31/2832* (2013.01); *H01L 23/10* (2013.01); *H01L 23/60* (2013.01)

(58) Field of Classification Search
CPC . H01L 23/60; H01L 27/0248; H01L 27/0251; H01L 27/0255; H01L 27/0259; H01L 27/0266; H01L 27/027; H01L 27/0292; H01L 2224/80125; H01L 2224/8111; H05K 1/0259; H05K 9/0067; H05K 9/0079

See application file for complete search history.

(56) References Cited

U.S. PATENT DOCUMENTS

| | | | | |
|---|---|---|---|---|
| 6,078,068 | A * | 6/2000 | Tamura | H01L 23/62 257/203 |
| 7,567,484 | B2 * | 7/2009 | Ochi | G02F 1/13452 365/185.27 |
| 7,843,019 | B2 * | 11/2010 | Mallikarjunaswamy | H01L 21/761 257/409 |

(Continued)

OTHER PUBLICATIONS

Wang, Title of Invention: Electrostatic Discharge Protection Circuit, U.S. Appl. No. 13/299,415, filed Nov. 18, 2011.

*Primary Examiner* — Hsien Ming Lee
(74) *Attorney, Agent, or Firm* — Winston Hsu

(57) ABSTRACT

An electrostatic discharge (ESD) shielding semiconductor device and an ESD testing method thereof, the ESD shielding semiconductor device includes an integrated circuit, a seal ring and a conductive layer. The integrated circuit is disposed on a die, and the integrated circuit has a first region and a second region. The seal ring is disposed on the die to surround the integrated circuit. The conductive layer at least covers the first region, and which is electrically connected to the seal ring.

8 Claims, 3 Drawing Sheets

(56) References Cited

U.S. PATENT DOCUMENTS

| | | | | |
|---|---|---|---|---|
| 9,023,688 B1* | 5/2015 | Or-Bach | ............. | H01L 23/3677 |
| | | | | 257/E21.532 |
| 9,541,601 B2* | 1/2017 | Pagani | ............... | G01R 31/2884 |
| 2017/0063376 A1* | 3/2017 | Bell | ......................... | G09C 1/00 |

* cited by examiner

US 10,522,530 B2

ELECTROSTATIC DISCHARGE SHIELDING SEMICONDUCTOR DEVICE AND ELECTROSTATIC DISCHARGE TESTING METHOD THEREOF

BACKGROUND OF THE INVENTION

1. Field of the Invention

The present invention relates to a semiconductor device and a testing method thereof, and more particularly, to a semiconductor device for electrostatic discharge shielding and a testing method thereof.

2. Description of the Prior Art

In the modern society, the micro-processor systems composed of integrated circuits (IC) have been utilized in diverse fields such as automatic control electronics, mobile communication devices and personal computers. With the development of technology and the increase of original applications for electrical products, the IC devices are becoming smaller, more delicate and more diversified.

As well known in the art, an IC device is produced from dies that are fabricated by conventional semiconductor manufacturing processes. The process for manufacturing a die starts with a wafer: first, different regions are marked on the wafer; secondly, conventional semiconductor manufacture processes such as deposition, photolithography, etching or planarization are used to form each circuit trace. Then, each region of the wafer is diced to form a die, and the dies are than assembled to form a chip, so as to obtain a complete assembling unit. As the semiconductor industry has progressed into nanometer technology process nodes in pursuit of highly integrated and high-speed operation, current techniques utilize miniaturized through holes and inter-layer dielectric layers to form a multilayered interconnected wiring structure to electrically connect a metal gate and source/drain regions of a transistor, thereby providing signal input/output pathways for the transistor.

However, all of these processes make the related CMOS IC products to become more susceptible to electrostatic discharge (ESD) damage. Therefore, ESD protection circuits are built onto the chip to protect the devices and circuits of the IC against ESD damage.

SUMMARY OF THE INVENTION

The present invention therefore provides an ESD shielding semiconductor device, in which a seal ring is additionally disposed to assist the circulation of the ESD current, so as to achieve the ESD protection function.

The present invention therefore further provides an ESD testing method, in which a seal ring is additionally formed to facilitate the circulation of the ESD current, so as to achieve the ESD protection function.

To achieve the purpose described above, the present invention provides a semiconductor device, including an integrated circuit, a seal ring and a conductive layer. The integrated circuit is disposed on a wafer, and the integrated circuit having a first region and a second region. The seal ring is disposed on the wafer to surround the integrated circuit. The conductive layer at least covers the first region, and the conductive layer is electrically connected to the seal ring.

To achieve the purpose described above, the present invention provides a semiconductor device, including the following steps. First of all, an integrated circuit is provided to be disposed on a wafer, and the integrated circuit has a first region and a second region which are surrounded by a seal ring. Next, a conductive layer is formed on the integrated circuit, to at least cover the first region, wherein the conductive layer is electrically connected to the seal ring. Then, an ESD current is provided to the seal ring for ESD testing.

Overall speaking, the present invention provides a semiconductor device, which includes a seal ring to surround the entire integrated circuit, and the seal ring may directly or indirectly connect to a conductive layer disposed on the integrated circuit. The conductive layer may optionally cover the entire regions of the integrated circuit, or cover particular regions of the integrated circuit via plural separated portions thereof. In this way, while an ESD testing of the semiconductor device is carried out, an ESD current is supplied to directly pass through the conductive layer or the seal ring, and finally to a low voltage power site, avoiding the ESD current damage to the main circuit of the integrated circuit.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
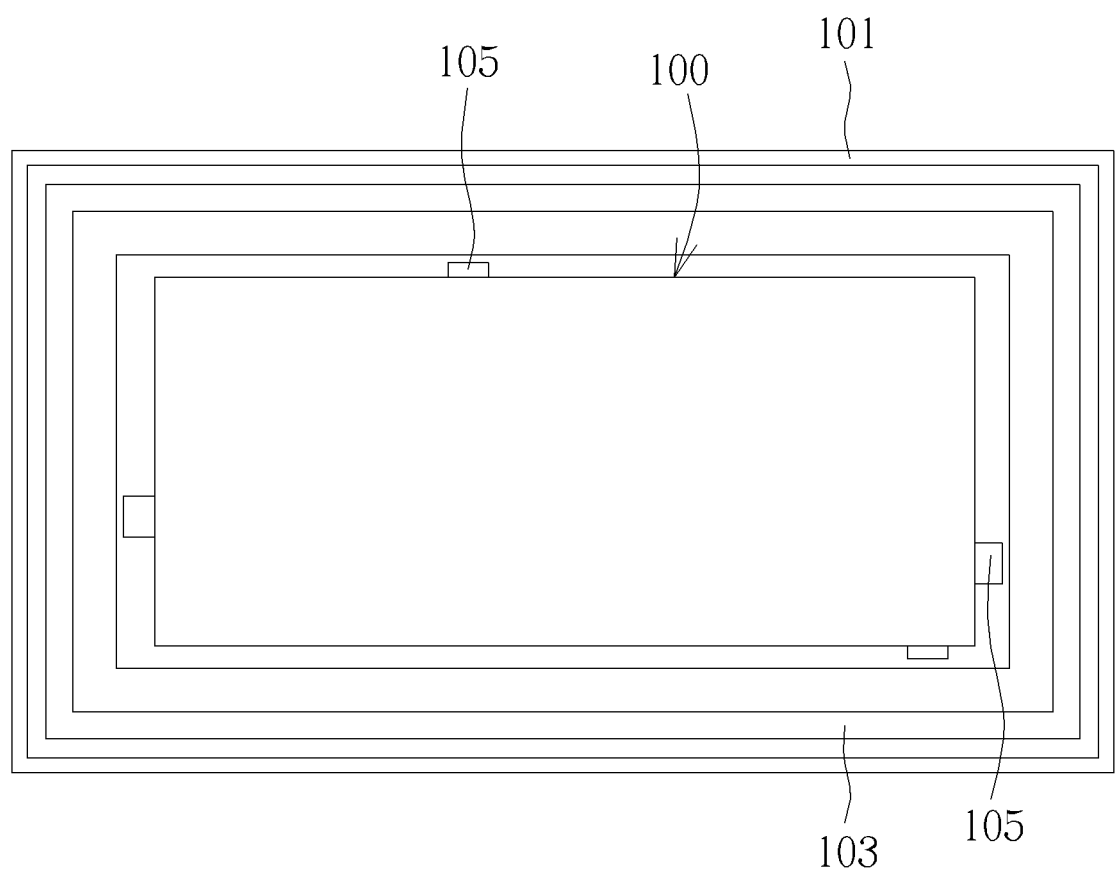
FIG. 1 is a schematic diagram illustrating a top view of an electrostatic discharge shielding semiconductor device according to a first preferred embodiment of the present invention.

Please refer to FIG. 1, which is a schematic diagram illustrating a semiconductor device for electrostatic discharge (ESD) protection according to the first embodiment of the present invention, in which, a plurality of integrated circuits (ICs) 100 as shown in FIG. 1 are formed on a wafer (not shown in the drawings), and each of the integrated circuits 100 are separated by a die saw region 101. Accordingly, a dicing process may be performed on the die saw region 101 in the subsequent process, to cut the integrated circuits 100 into individual die (not shown in the drawings), with each of dies including each integrated circuit 100. The integrated circuit 100 includes various regions such as a core logic region (not shown in the drawings), a high frequency region (not shown in the drawings) or a periphery region (not shown in the drawings) formed thereon, and those regions are consisted of any required circuit and interconnection structure being formed through various processes such as a deposition process, a lithography process or a planarization process.

The integrated circuit 100 further includes at least one low voltage power site 105 such us aground site. As long as an ESD current is supplied from a high voltage power site (not shown in the drawings), the ESD current passes through a metal interconnection or other ESD protection structure, and then to the low voltage power site 105, thereby avoiding the ESD current to damage the main circuit.

In the present embodiment, a seal ring 103 is additionally disposed on the wafer to surround the integrated circuit 100. Precisely speaking, the seal ring 103 for example includes a low resistance metal such as copper (Cu), aluminum (Al) or tungsten (W), and the seal ring 103 is disposed between the die saw region 101 and the integrated circuit 100, to prevent from any possible delaminating or pealing issues of structures or films during the dicing process, and to avoid the integrated circuit 100 getting damage thereby.

Based on the foregoing description, the semiconductor device of the present embodiment additionally disposes the sealing ring 103 to surround each of the integrated circuits 100 on the wafer, in order to prevent the integrated circuit 100 suffering from any physically damages during the dicing process. In addition, after forming the integrated circuit 100, an ESD testing is carried out through the metal interconnection formed in the integrated circuit 100, by supplying an ESD current to pass through the metal interconnection, and finally to the low voltage power site 105, to achieve the ESD protection function.

However, in some situations, if a large ESD current is supplied under some special circumstances, excessive current may directly damage the metal interconnection in the integrated circuit 100, and may further interfere with the normal function and the overall performance of the semiconductor device. Therefore, it should be fully understood by those skilled in the art, the semiconductor device of the present invention may also include other examples, and is not limited to the aforementioned embodiments. The following description will detail the different embodiments of the ESD protection device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
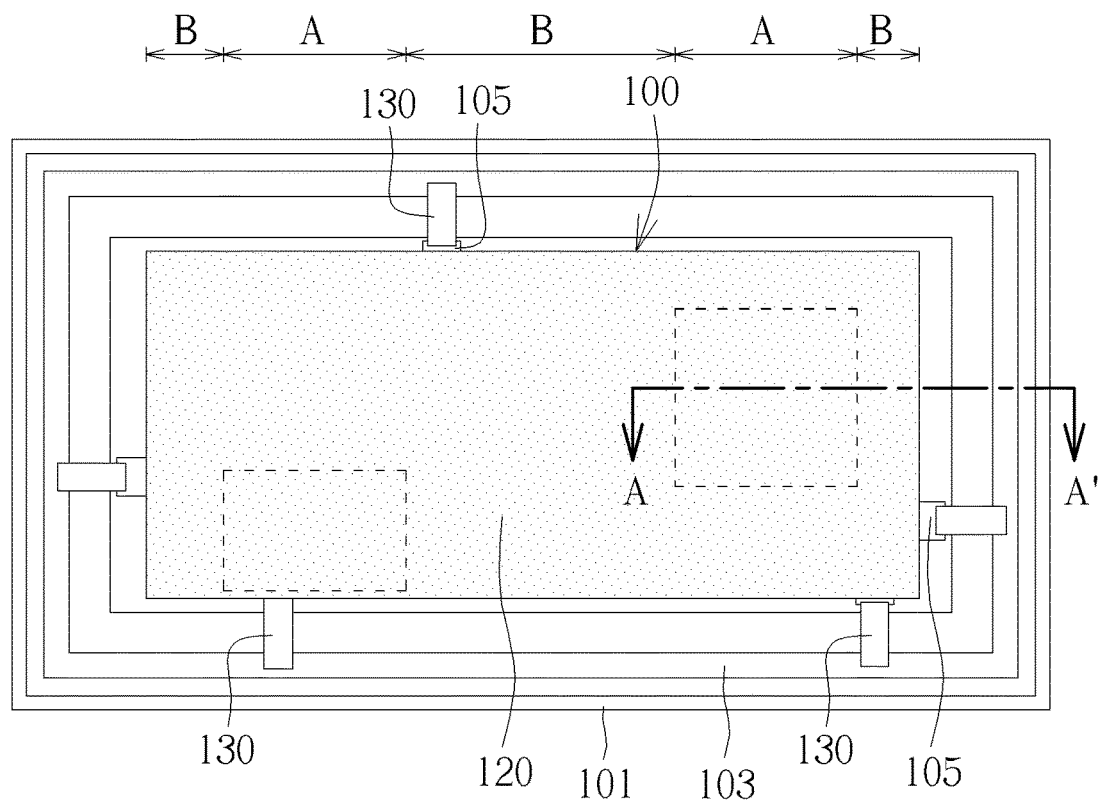
FIG. 2 is a schematic diagram illustrating a top view of an electrostatic discharge shielding semiconductor device according to a second preferred embodiment of the present invention.

Please refer to FIG. 2, which is a schematic diagram illustrating a semiconductor device for ESD protection according to the second embodiment of the present invention. The semiconductor device of the present embodiment also includes a plurality of integrated circuits 100 as shown in FIG. 1 and a die saw region 101, the features and the relative dispositions of the aforementioned elements are substantially the same as those in the aforementioned first embodiment, and will not be redundantly described hereinafter. The differences between the present embodiment and the aforementioned first embodiment are that a conductive layer 120 is additionally disposed on each integrated circuit 100.

Figure 3:
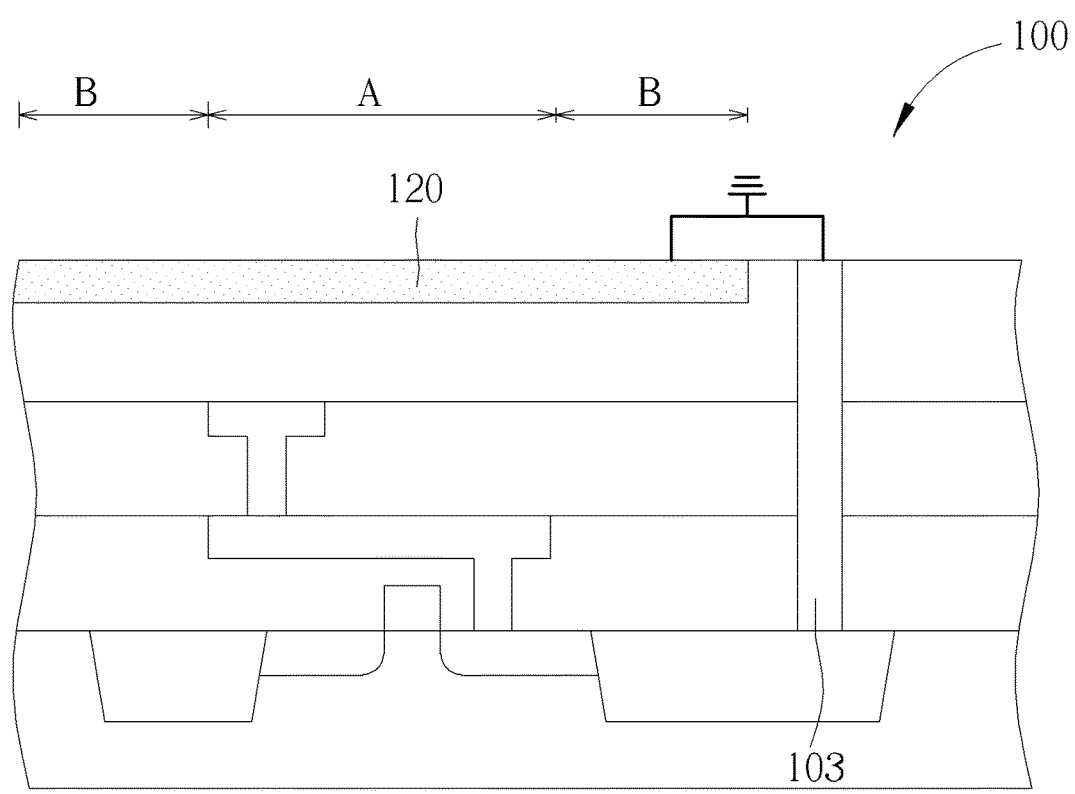
FIG. 3 is a schematic cross-sectional view taken along a cross line A-A' in FIG. 2.

The conductive layer 120 also includes a low resistant metal such as copper, aluminum or tungsten. The material of the conductive layer 120 may be the same as or different from that of the sealing ring 103, but not limited thereto. It is noted that, in the present embodiment, the conductive layer 120 preferably covers the entire regions A and B formed on the integrated circuit 100, wherein the region A may include a main circuit such as a core region or a high-frequency region, and the region B may include a peripheral region, as shown in FIG. 2 and FIG. 3. Furthermore, the conductive layer 120 is electrically connected to the sealing ring 103. For example, the seal ring 103 is electrically connected to the low voltage power site 105 through a metal wire 130, and the conductive layer 120 is also electrically connected to the low voltage power site 105 through another wire or other connecting structure (not shown in the drawings). That is, the conductive layer 120 and the seal ring 103 are simultaneously electrically connected to the low voltage power site 105, and the conductive layer 120 and the seal ring 103 are therefore electrically connected to each other, and both connected to a ground site, as shown in FIG. 2 and FIG. 3.

With this arrangement, the conductive layer 120 is allowable to be used as an ESD shielding layer. As long as a large ESD current is supplied, the ESD current firstly passes through the conductive layer 120, further through the metal interconnection or other ESD protection structure formed with in the integrated circuit 100, and finally to the low voltage power site 105. Otherwise, the ESD current may also pass through the conductive layer 120 to the seal ring 103, and finally to the low voltage power site 105. In other words, through the electrical connection between the conductive layer 120 and the seal ring 103, the conductive layer 120 and the seal ring 103 may therefore facilitate the circulation of the ESD current, thereby avoiding excessive currents generated under special circumstances damage to the main circuit in the integrated circuit 100.

According to above, it is noted that the semiconductor device of the present embodiment further disposes the conductive layer 120 in the integrated circuit 100, to cover the region A and the region B of the integrated circuit 100, and the conductive layer 120 is electrically connected to the seal ring 103. Thus, through disposing the seal ring 103 of the present embodiment, not only can prevent the integrated circuit 100 suffering from those physically influences during the dicing process, but also can assist the circulation of the ESD protection function. Namely, the ESD testing of this embodiment may be carried out by directly supplying an ESD current to the conductive layer 120 on the integrated circuit 100, or to the seal ring 103 surrounding the integrated circuit 100, followed by passing the ESD current to the low voltage power site 105 for ESD protection. In addition, although the connection of the seal ring 103 and the conductive layer 120 in the present embodiment is accomplished through respectively connecting the seal ring 103 and the conductive layer to the low voltage power site 105 via different wires, the practical arrangement thereof is not limited thereto and may also be achieved through other strategy. In other embodiments, the seal ring 103 and the conductive layer 120 may be directly electrically connected with other via other connection methods based on practical requirements.

Figure 4:
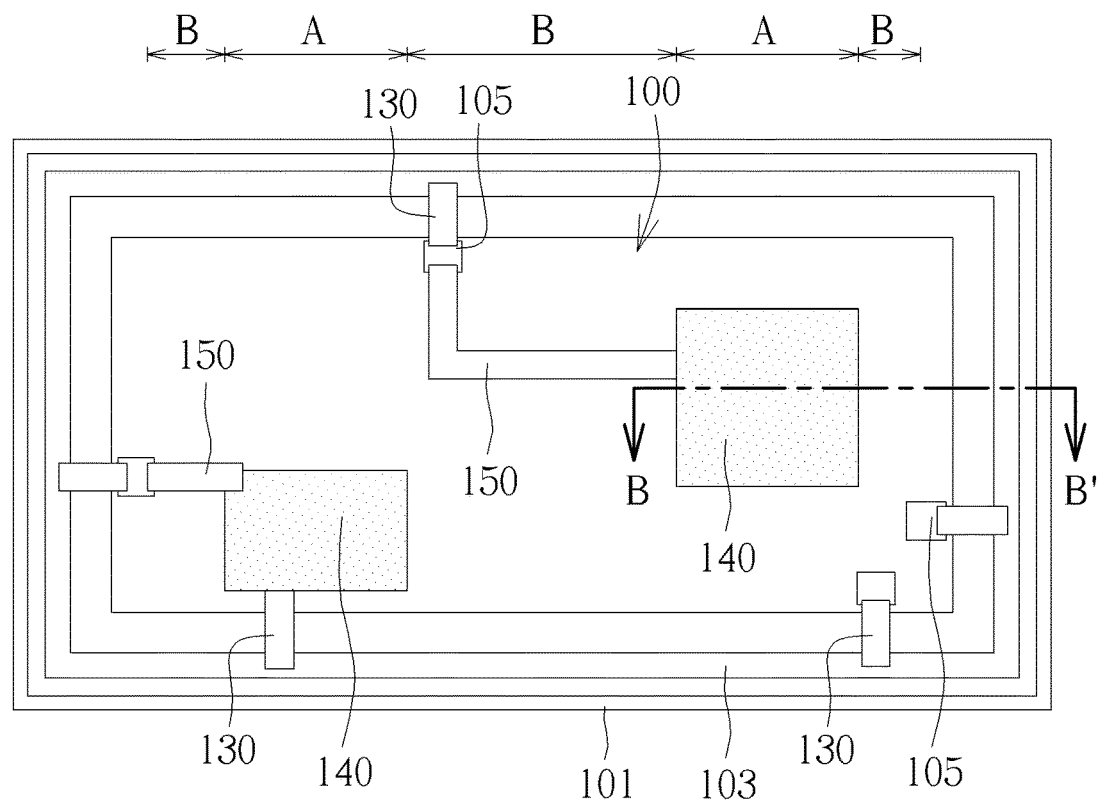
FIG. 4 is a schematic diagram illustrating a top view of an electrostatic discharge shielding semiconductor device according to a third preferred embodiment of the present invention.

Please refer to FIG. 4, which is a schematic diagram of a semiconductor device for ESD protection according to the third embodiment of the present invention. The semiconductor device of the present embodiment also includes a plurality of integrated circuits 100 and a die saw region 101 as shown in FIG. 1, the features and the relative dispositions of the aforementioned elements are substantially the same as those in the aforementioned first embodiment, and will not be redundantly described hereinafter. The differences between the present embodiment and the aforementioned embodiment are at least one conductive layer 140 is disposed on each integrated circuit 100 in the present embodiment, with each conductive layer 140 being separated from each other and only covering only a particular region of the integrated circuit 100.

Although the present embodiment is exemplified by forming two conductive layers 140 separated from each other, the practical number and the disposition of the conductive layer may be adjusted according to the product requirements, and not limited thereto. The conductive layer 140 also includes a low resistant metal material such as copper, aluminum, or tungsten. The material of the conductive layer 140 may be the same as or different from that of the seal ring 103, but not limited to this. Also, each conductive layer 140 is electrically connected to the seal ring 103. In this embodiment, the seal ring 103 and the conductive layers 140 are electrically connected to the low voltage power site 105 respectively through the wires 130, 150, and the conductive layer 140 may be electrically connected to the seal ring 103 thereby.

Figure 5:
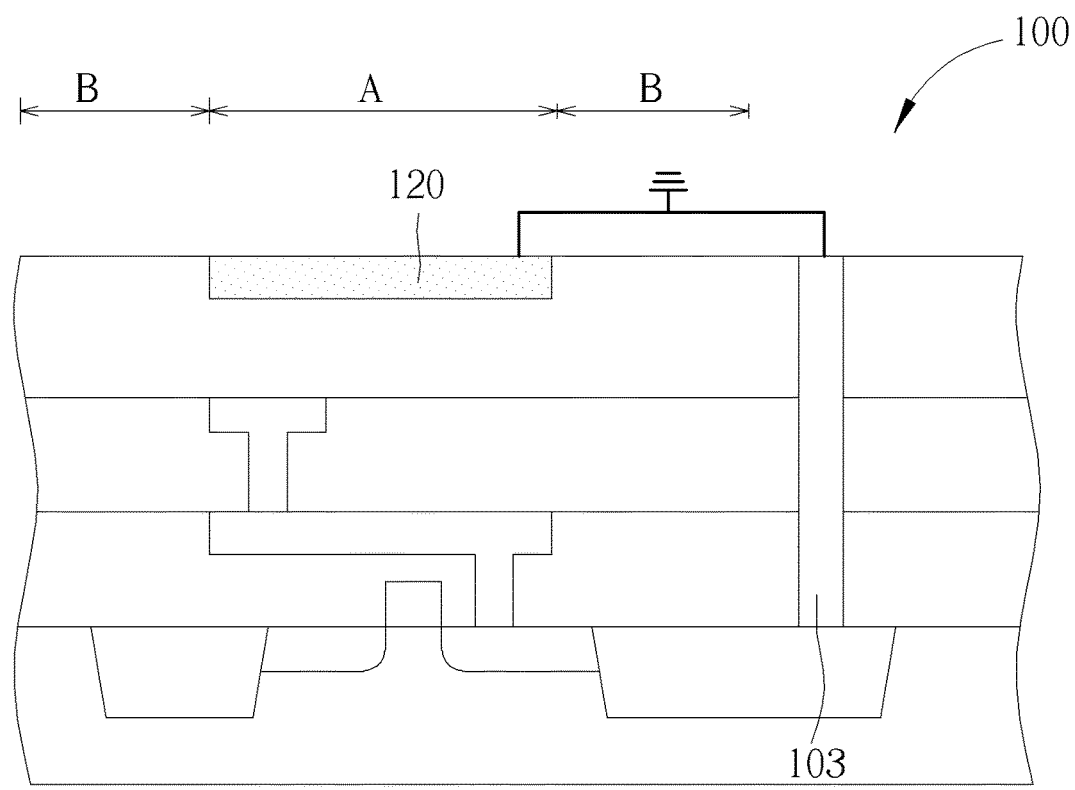
FIG. 5 is a schematic cross-sectional view taken along a cross line B-B' in FIG. 4.

It is noted that, in the present embodiment, the conductive layer 140 preferably covers only a main region of the integrated circuit 100 instead of covering the entire regions. For example, the conductive layer 140 only covers the region A such as a high frequency region or a core region, according to the product requirements, to expose the region B such as a region which is used to receive an appropriate power or signal, as shown in FIGS. 4 and 5. Thus, the conductive layers 140 may also serve as an ESD shielding layer to protect the circuit in the region A, and to avoid functions (like receiving singles and power) of the region B being blocked by the conductive layers 140. Therefore, as long as a large ESD current is supplied, the ESD current will also pass through the conductive layers 140 or the seal ring 103 firstly, further through the metal interconnections formed in the integrated circuit 100, and finally to the low voltage power site 105, avoiding excessive currents damage to the main circuit in the region A.

According to the foregoing description, the semiconductor device of this embodiment disposes at least one conductive layer 140 in the integrated circuit 100, each conductive layer 140 optionally covers only a particular region like a core region or a high frequency region of the integrated circuit 100. In this way, through disposing the seal ring 103, not only can both a achieve the physical protection and ESD protection functions, but also can effectively reduce the coverage of the conductive layer 140. That is, the process cost is saving, and also, it is sufficient to avoid functions of some regions being blocked by the conductive layer 140.

Overall speaking, the present invention provides a semiconductor device, which includes a seal ring to surround the entire integrated circuit, and the seal ring may directly or indirectly connect to a conductive layer disposed on the integrated circuit. The conductive layer may optionally cover the entire regions of the integrated circuit, or cover particular regions of the integrated circuit via plural separated portions. In this way, while an ESD testing of the semiconductor device is carried out, an ESD current is supplied to directly pass through the conductive layer or the seal ring, and finally to a low voltage power site, avoiding the ESD current damage to the main circuit of the integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) shielding semiconductor device, comprising:
    an integrated circuit disposed on a wafer, the integrated circuit having a core region and a peripheral region;
    a seal ring disposed on the wafer to surround the integrated circuit; and
    an ESD shielding layer at least covering the core region, wherein the ESD shielding layer is not overlapped with the seal ring, and the ESD shielding layer shields the entire core region and is electrically connected to the seal ring through a metal wire.

2. The ESD shielding semiconductor device according to claim 1, wherein the seal ring and the ESD shielding layer are electrically to a ground site.

3. The ESD shielding semiconductor device according to claim 1, further comprising:
    a die saw region, surrounding the integrated circuit and the seal ring, and the seal ring being disposed between the integrated circuit and the die saw region.

4. The ESD shielding semiconductor device according to claim 1, wherein the peripheral region is exposed from the ESD shielding layer.

5. The ESD shielding semiconductor device according to claim 1, wherein the peripheral region is covered by the ESD shielding layer.

6. An electrostatic discharge (ESD) testing method, comprising:
    providing an integrated circuit disposed on a wafer, the integrated circuit having a core region and a peripheral region and being surrounded by a seal ring;
    forming an ESD shielding layer on the integrated circuit, at least covering the core region, wherein the ESD shielding layer is not overlapped with the seal ring, and the ESD shielding layer shields the entire core region and is electrically connected to the seal ring through a metal wire; and
    providing an ESD current to the seal ring for ESD testing.

7. The ESD testing method according to claim 6, wherein the seal ring and the ESD shielding layer are electrically to a ground site.

8. The ESD testing method according to claim 6, further comprising:
    forming a die saw region, to surround the integrated circuit and the seal ring, and the seal ring being disposed between the integrated circuit and the die saw region.

* * * * *